(12) United States Patent
Chen et al.

(10) Patent No.: US 12,255,232 B2
(45) Date of Patent: Mar. 18, 2025

(54) GALLIUM NITRIDE DRAIN STRUCTURES AND METHODS OF FORMING THE SAME

(71) Applicant: Taiwan Semiconductor Manufacturing Company, Ltd., Hsinchu (TW)

(72) Inventors: Chi-Ming Chen, Zhubei (TW); Kuei-Ming Chen, New Taipei (TW); Yung-Chang Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 466 days.

(21) Appl. No.: 17/804,751

(22) Filed: May 31, 2022

(65) Prior Publication Data

US 2023/0387203 A1    Nov. 30, 2023

(51) Int. Cl.
| | |
|---|---|
| H01L 29/08 | (2006.01) |
| H01L 21/02 | (2006.01) |
| H01L 21/223 | (2006.01) |
| H01L 21/306 | (2006.01) |
| H01L 29/06 | (2006.01) |
| H01L 29/20 | (2006.01) |
| H01L 29/207 | (2006.01) |
| H01L 31/112 | (2006.01) |

(52) U.S. Cl.
CPC .... *H01L 29/0847* (2013.01); *H01L 21/02576* (2013.01); *H01L 21/2233* (2013.01); *H01L 21/30612* (2013.01); *H01L 29/0657* (2013.01); *H01L 29/2003* (2013.01); *H01L 29/207* (2013.01); *H01L 31/112* (2013.01)

(58) Field of Classification Search
CPC .......... H01L 29/0847; H01L 21/02576; H01L 21/2233; H01L 21/30612; H01L 29/0657; H01L 29/2003; H01L 29/207; H01L 31/112; H01L 29/083; H01L 29/66356; H01L 27/14614; H01L 27/14616; H01L 29/267; H01L 29/7391; H01L 27/14694
See application file for complete search history.

(56) References Cited

U.S. PATENT DOCUMENTS

2017/0294508 A1* 10/2017 Hsu ..................... H01L 29/0847

* cited by examiner

*Primary Examiner* — Karen Kusumakar
(74) *Attorney, Agent, or Firm* — Harrity & Harrity, LLP

(57) ABSTRACT

Depositing gallium nitride and carbon (GaN:C) (e.g., in the form of composite layers) when forming a gallium nitride drain of a transistor provides a buffer between the gallium nitride of the drain and silicon of a substrate in which the drain is formed. As a result, gaps and other defects caused by lattice mismatch are reduced, which improves electrical performance of the drain. Additionally, current leakage into the substrate is reduced, which further improves electrical performance of the drain. Additionally, or alternatively, implanting silicon in an aluminum nitride (AlN) liner for a gallium nitride drain reduces contact resistance at an interface between the gallium nitride and the silicon. As a result, electrical performance of the transistor is improved.

20 Claims, 24 Drawing Sheets

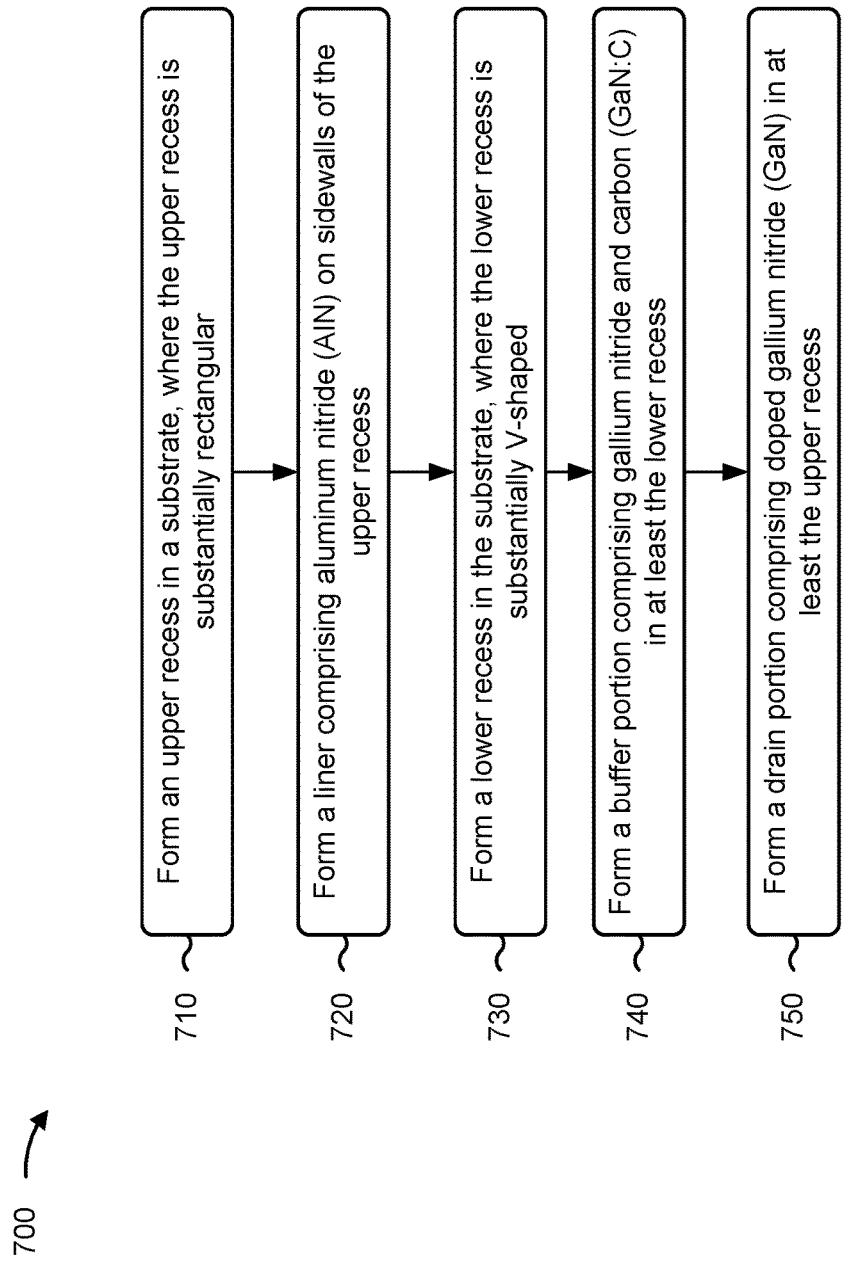

GALLIUM NITRIDE DRAIN STRUCTURES AND METHODS OF FORMING THE SAME

BACKGROUND

In transistor structures, such as a complementary metal-oxide-semiconductor (CMOS), and in photonic structures, such as a pixel, higher breakdown voltages allow the transistor to function across a wider range of input signals without breaking. Gallium nitride (GaN) can be used as a material for forming a drain of the transistor in order to improve breakdown voltage of the transistor because of the high bandgap exhibited by gallium nitride.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6 and 7 are flowcharts of example processes associated with forming semiconductor structures described herein.

DETAILED DESCRIPTION

Figure 1:
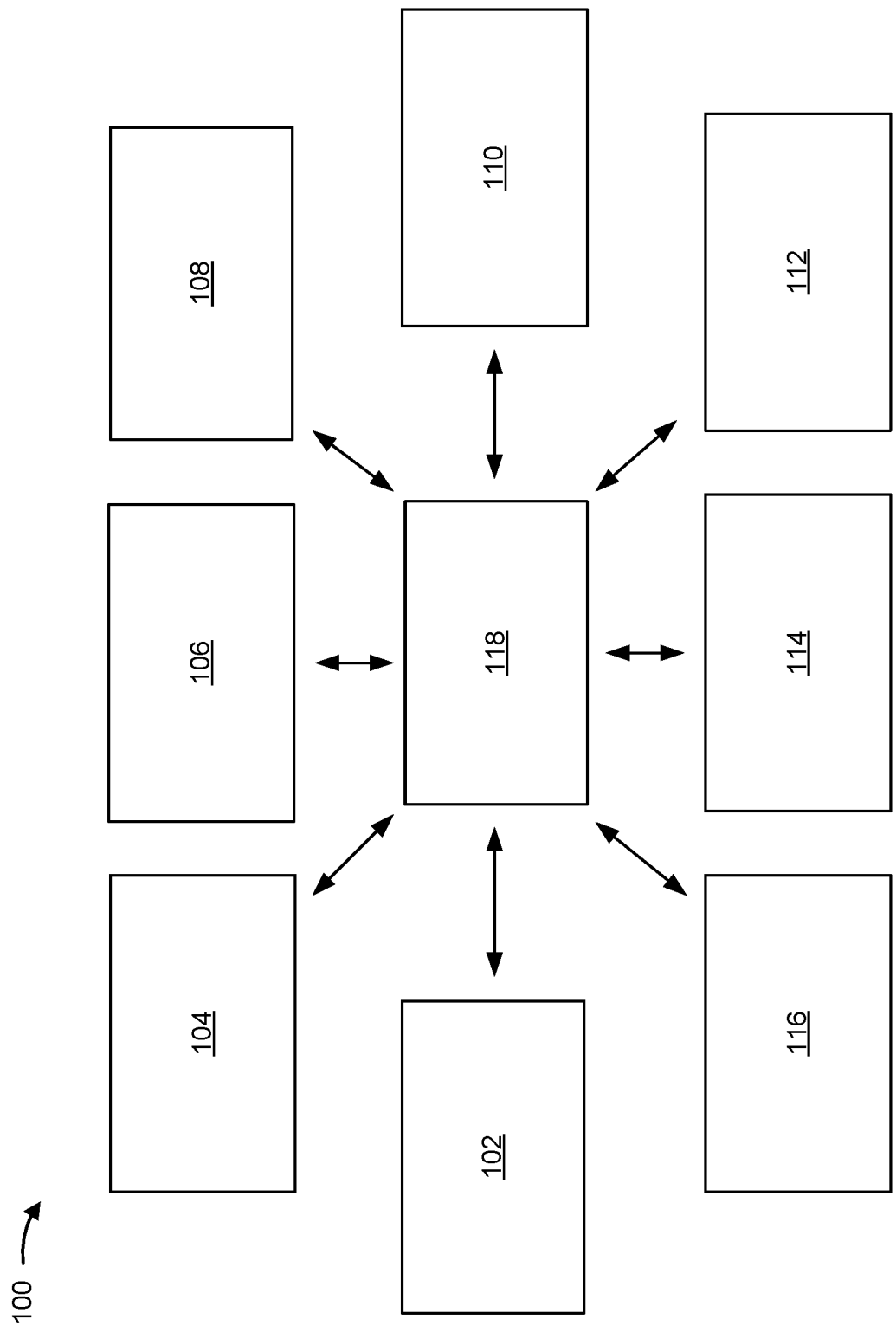
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, gallium nitride (GaN) can be used as a material for forming a drain of a transistor in order to improve breakdown voltage of the transistor because of the high bandgap exhibited by gallium nitride. However, gallium nitride has a significant lattice mismatch with silicon (Si), which is typically used to form the substrate in which the drain will be formed. As a result, defects occur when forming the gallium nitride, such as gaps in the drain. Additionally, the thermal expansion coefficients of gallium nitride and silicon are significantly different, which results in bowing and cracking of the substrate in which the transistor is formed.

Accordingly, aluminum nitride (AlN) is often deposited at an interface between silicon and gallium nitride to reduce lattice mismatch and thermal expansion coefficient difference. However, drain defects as well as wafer stress still persist in gallium nitride drains. Additionally, aluminum nitride causes increased resistance at an interface between the gallium nitride drain and an n-doped channel formed in the substrate.

Some implementations described herein provide techniques and apparatuses for depositing gallium nitride and carbon (GaN:C) (e.g., in the form of composite layers) when forming a gallium nitride drain. The GaN:C provides a buffer between the gallium nitride of the drain and silicon of a substrate (e.g., a wafer) in which the drain is formed. As a result, gaps and other defects caused by lattice mismatch are reduced, which improves electrical performance of the drain. Additionally, current leakage into the substrate is reduced, which further improves electrical performance of the drain.

Additionally, or alternatively, some implementations described herein provide techniques and apparatuses for implanting silicon in an aluminum nitride (AlN) liner for a gallium nitride drain. The implanted silicon reduces contact resistance at an interface between the gallium nitride and the silicon caused by the aluminum nitride. As a result, electrical performance of the transistor is improved.

FIG. 1 is a diagram of an example environment 100 in which systems and/or methods described herein may be implemented. The example environment 100 includes semiconductor processing tools that can be used to form semiconductor structures and devices, such as a conductive structure as described herein.

As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The photoresist removal tool 116 is a semiconductor processing tool that is capable of etching a photoresist layer. In some implementations, the photoresist removal tool 116 includes a chamber that is filled with a chemical stripper, and a substrate with the photoresist layer is placed in the chamber for a particular time period to remove the photoresist layer. In some implementations, the photoresist removal tool 116 etches the photoresist layer using plasma ashing.

The wafer/die transport tool 118 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-116 and/or to and from other locations such as a wafer rack, a storage room, or another location. In some implementations, the wafer/die transport tool 118 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
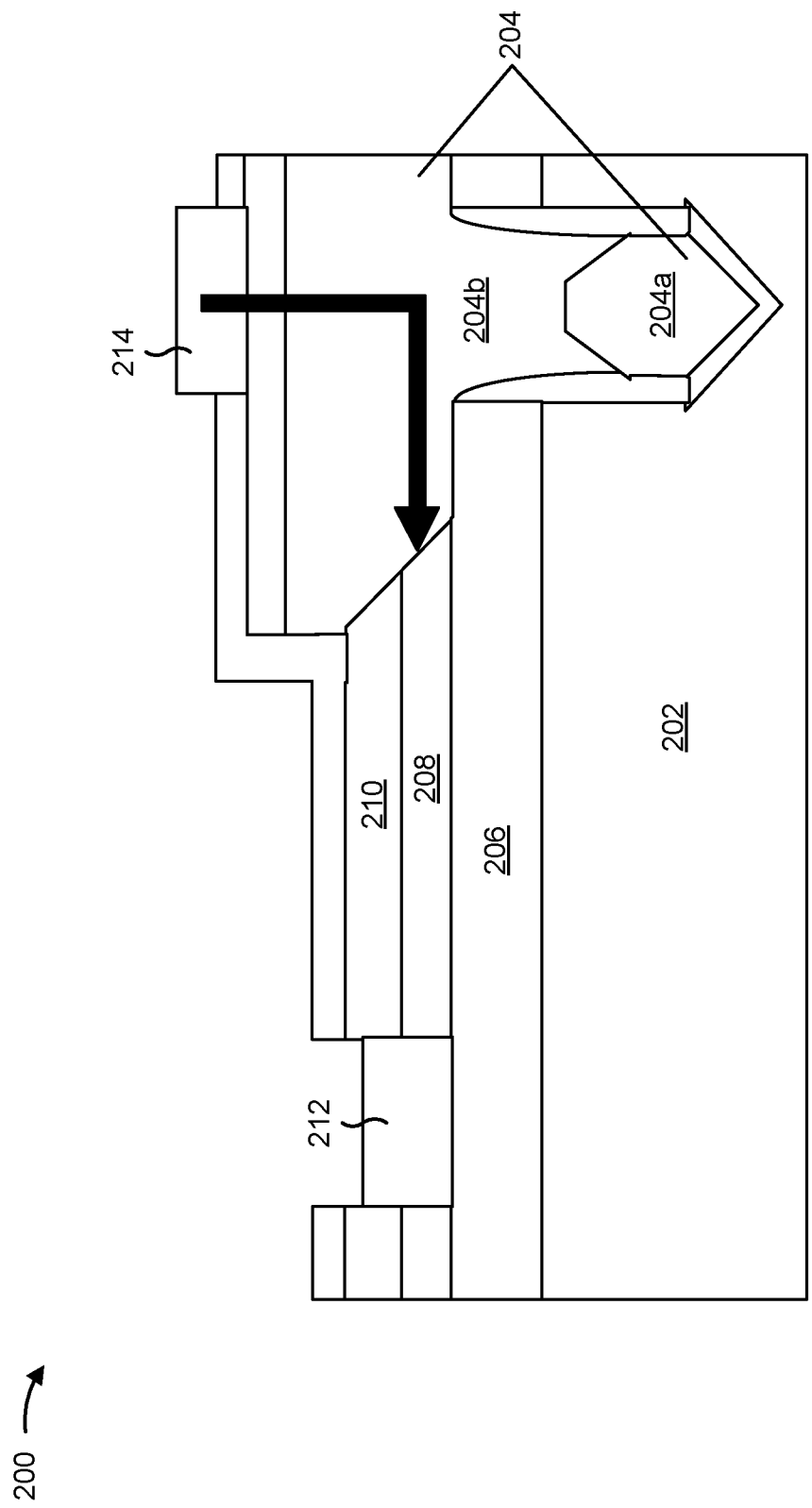
FIG. 2 is a diagram of an example semiconductor structure described herein.

FIG. 2 is a diagram of an example pixel sensor 200 described herein. In some implementations, the pixel sensor 200 may be included in a pixel array. In some implementations, the pixel sensor 200 is included in an image sensor. The image sensor may be a complementary metal-oxide-semiconductor (CMOS) image sensor, a back side illuminated (BSI) CMOS image sensor, or another type of image sensor.

FIG. 2 illustrates a cross-section view of the pixel sensor 200. As shown in FIG. 2, the pixel sensor 200 may include a substrate 202. The substrate 202 may include a semiconductor die substrate, a semiconductor wafer, or another type of substrate in which semiconductor pixels may be formed. In some implementations, the substrate 202 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 202 is formed of a doped material (e.g., a p-doped material or an n-doped material), such as a doped silicon.

As further shown in FIG. 2, the pixel sensor 200 may include a drain structure 204 comprising gallium nitride (GaN). As described herein, the drain structure 204 may include a first portion 204a formed of gallium nitride and carbon (GaN:C) and a second portion 204b formed of crystalline GaN (e.g., cubic GaN or c-GaN). As a result, current leakage into the substrate 202 is reduced by the GaN:C. Additionally, gaps and other defects in the drain structure 204 are reduced because the GaN:C of the first portion 204a fills the substantially V-shaped trench in the substrate 202 in order to allow growth of c-GaN in the second portion 204b. Otherwise, the drain structure 204 would include a combination of hexagonal GaN (h-GaN) with c-GaN that would result in gaps in the drain structure 204. As used herein, "substantially V-shaped" refers to a three-dimensional structure where at least one cross-section of the structure (e.g., the cross-section depicted in FIG. 2) has a surface (e.g., a bottom surface in example pixel sensor 200) characterized by a first portion that is slanted relative to a horizontal axis and a second portion that is also slanted relative to the horizontal axis, where the first portion and the second portion intersect at an angle in a range from approximately 10° to approximately 170°.

In some implementations, and as shown in FIG. 2, the pixel sensor 200 may further include a dielectric layer 206 supporting an n-doped channel 208 (e.g., formed of n-doped silicon) and a photoresist layer 210. The dielectric layer 206 may include a silicon nitride ($SiN_x$), an oxide (e.g., a silicon oxide ($SiO_x$) and/or another oxide material), and/or another type of dielectric material. The photoresist layer 210 may include a metal, a silicon oxide ($SiO_x$), and/or another photoresist material.

In some implementations, the drain structure 204 may include an aluminum nitride (AlN) liner in order to reduce lattice and thermal expansion coefficient mismatch between the substrate 202 and the drain structure 204. Additionally, the aluminum nitride liner may include implanted silicon atoms at least at an interface between the channel 208 and the drain structure 204, as described in connection with FIG. 3. As a result, contact resistance is reduced at the aluminum nitride liner to improve current flow in the pixel sensor 200, as described in further detail below.

The pixel sensor 200 further includes a source 212. For example, the source 212 may be formed of p-doped material to complement the n-doped drain structure 204. For example, the source 212 may include p-doped silicon and/or another semiconductor material. Accordingly, FIG. 2 further illustrates an example current flow path (e.g., a photocurrent flow path) from a drain contact 214 through the drain structure 204 and to the source 212 via the channel 208. In some implementations, the current may be a photocurrent generated by photons of incident light absorbed in a photodiode connected to contact 214. For example, the contact 214 may include a metal such as ruthenium (Ru), copper (Cu), cobalt (Co), tungsten (W), and/or another conductive material.

The pixel sensor 200 may be electrically connected to a back-end-of-line (BEOL) metallization stack (not shown) of the image sensor. The BEOL metallization stack may electrically connect the pixel sensor 200 to control circuitry that may be used to measure the accumulation of incident light in the pixel sensor 200 and convert the measurements to an electrical signal.

As indicated above, FIG. 2 is provided as an example. Other examples may differ from what is described with regard to FIG. 2.

Figure 3:
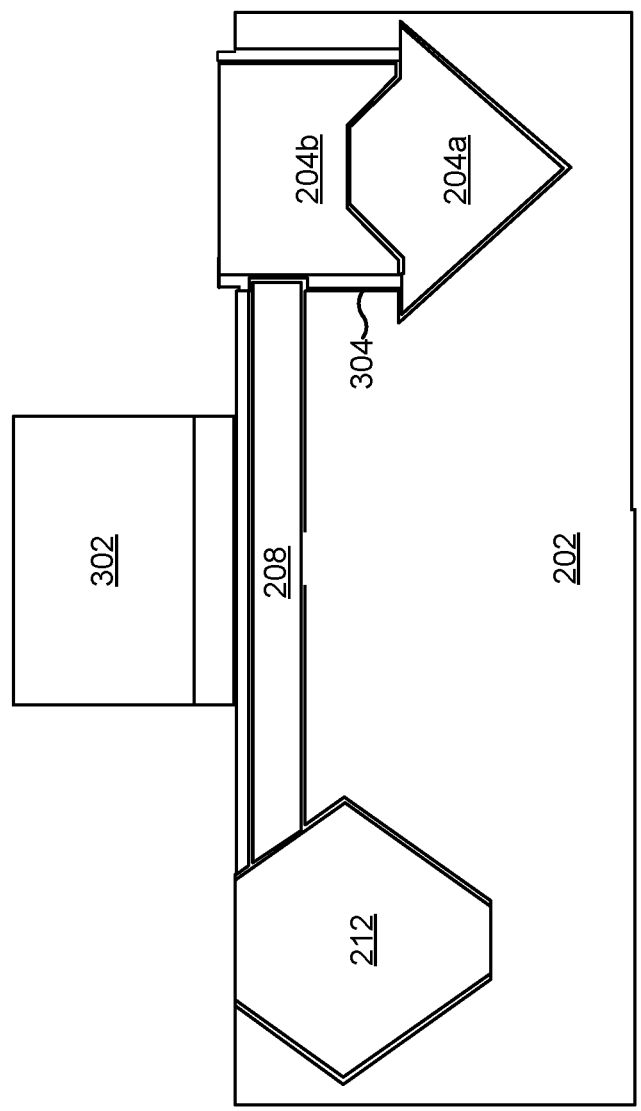
FIG. 3 is a diagram of an example semiconductor structure described herein.

FIG. 3 is a diagram of an example transistor 300 described herein. In some implementations, the transistor 300 may be included in an electronic device, such as a memory device, a logic device, a processor, an input/output device, or another type of semiconductor device that includes one or more transistors.

FIG. 3 illustrates a cross-section view of the transistor 300. As shown in FIG. 3, the transistor 300 may include a substrate 202. The substrate 202 may include a semiconductor die substrate, a semiconductor wafer, or another type of substrate in which semiconductor transistors may be formed. In some implementations, the substrate 202 is formed of silicon (Si) (e.g., a silicon substrate), a material including silicon, a III-V compound semiconductor material such as gallium arsenide (GaAs), a silicon on insulator (SOI), or another type of semiconductor material. In some implementations, the substrate 202 is formed of a doped material (e.g., a p-doped material or an n-doped material), such as a doped silicon.

As further shown in FIG. 3, the transistor may include a gallium nitride (GaN) drain. As described herein, the drain may include a first portion 204a formed of gallium nitride and carbon (GaN:C) and a second portion 204b formed of crystalline GaN (e.g., cubic GaN or c-GaN). As a result, current leakage into the substrate 202 is reduced by the GaN:C. Additionally, gaps and other defects in the drain are reduced because the GaN:C of the first portion 204a fills the substantially V-shaped trench in the substrate 202 in order to allow growth of c-GaN in the second portion 204b. Otherwise, the drain would include a combination of hexagonal GaN (h-GaN) with c-GaN that would result in gaps in the drain. In some implementations, and as shown in FIG. 3, the transistor 300 may further include an n-doped channel 208 (e.g., formed of n-doped silicon).

In some implementations, the second portion 204b of the drain may include a liner 304 comprising aluminum nitride (AlN) in order to reduce lattice and thermal expansion coefficient mismatch between the substrate 202 and the GaN of the drain structure 204. Additionally, the liner 304 may include implanted silicon atoms at least at an interface between the channel 208 and the GaN of the drain structure 204. As a result, contact resistance is reduced at the liner 304 to improve current flow in the transistor 300, as described in further detail below.

The transistor 300 further includes a source 212. For example, the source 212 may be formed of a p-doped material to complement the n-doped drain. Accordingly, current may flow from the drain to the source 212 via the channel 208. In some implementations, the current may be input to the drain via a drain contact (not shown). Because the drain structure 204 comprises GaN, the current may be associated with a current density of at least 5400 milliamperes per millimeter (mA/mm) at 10 Volts (V).

As further shown in FIG. 3, the transistor 300 includes a gate structure 302. In some implementations, the gate structure 302 may be formed of a polysilicon material, a metal (e.g., tungsten (W) or another metal), and/or another type of conductive material. In some implementations, the gate structure 302 may comprise multiple layers of material, such as multiple layers of metal or multiple layers including at least one polysilicon layer and at least one metal layer, among other examples. The gate structure 302 may be electrically isolated by one or more sidewall spacers, such as spacers on each side of the gate structure 302. The spacers may include a silicon oxide ($SiO_x$), a silicon nitride ($Si_xN_y$), a silicon oxy carbide (SiOC), a silicon oxycarbonitride (SiOCN), and/or another suitable material. In some implementations, the gate structure 302 may be associated with a breakdown field larger than $7 \times 10^5$ Volts per centimeter (V/cm). By using GaN for the drain structure 204, the breakdown field is increased beyond $7 \times 10^5$ V/cm and up to, for example, $35 \times 10^5$ V/cm. Increasing the breakdown field allows for the gate structure 302 to be operated over a larger range of voltages (e.g., up to 10 V rather than up to 3.2 V) as compared with using silicon for the drain structure 204.

The transistor 300 may be electrically connected to a BEOL metallization stack (not shown) of the electronic device. The BEOL metallization stack may electrically connect the transistor 300 to control circuitry that may be used to activate and deactivate current flow in the transistor 300 via the gate structure 302.

As indicated above, FIG. 3 is provided as an example. Other examples may differ from what is described with regard to FIG. 3.

Figure 4A:
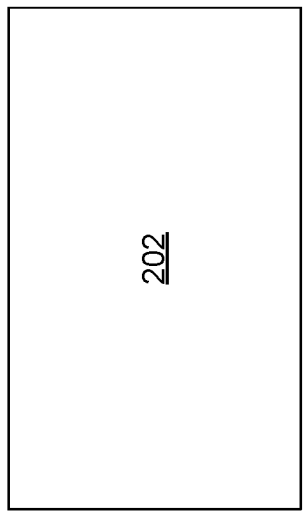
FIGS. 4A-4R are diagrams of an example implementation described herein.
Figure 4B:
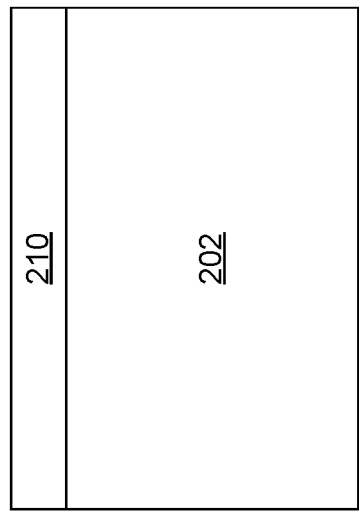
Figure 4C:
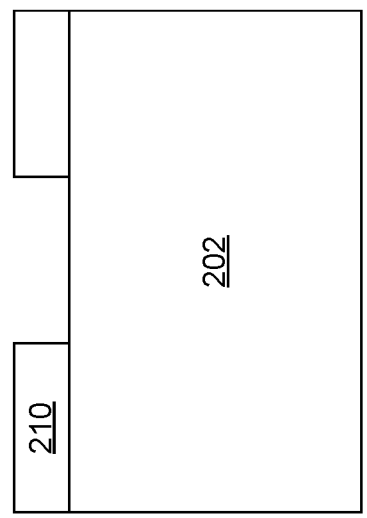
Figure 4D:
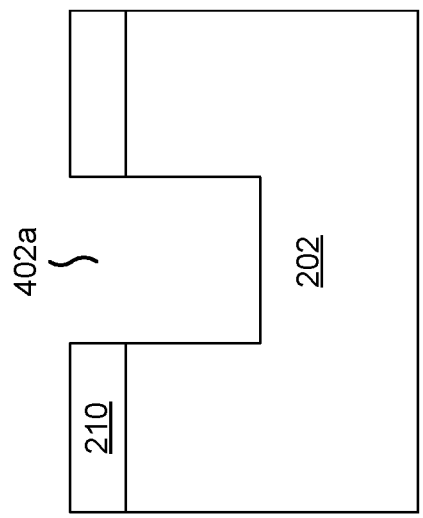
Figure 4E:
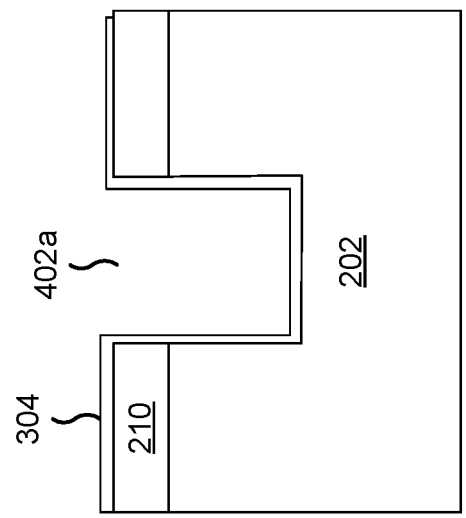
Figure 4F:
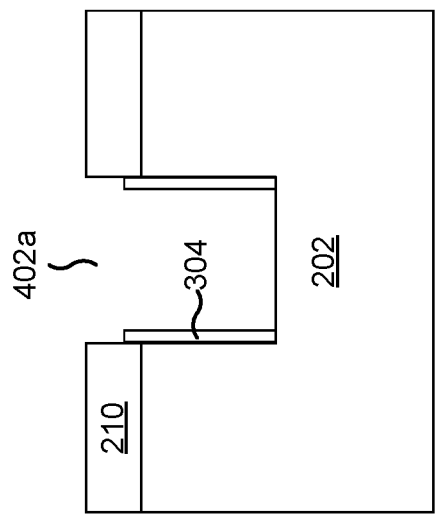
Figure 4G:
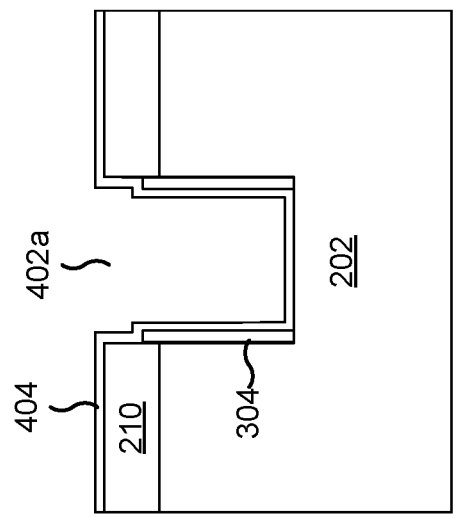
Figure 4H:
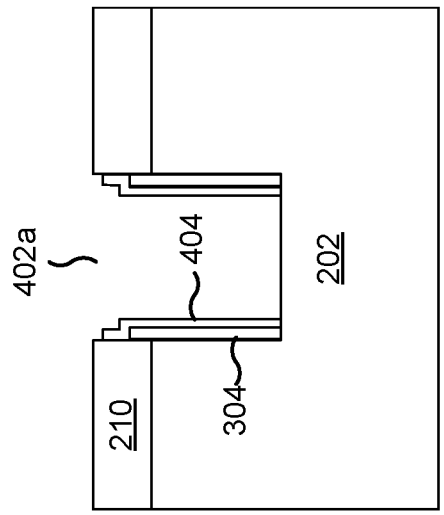
Figure 4I:
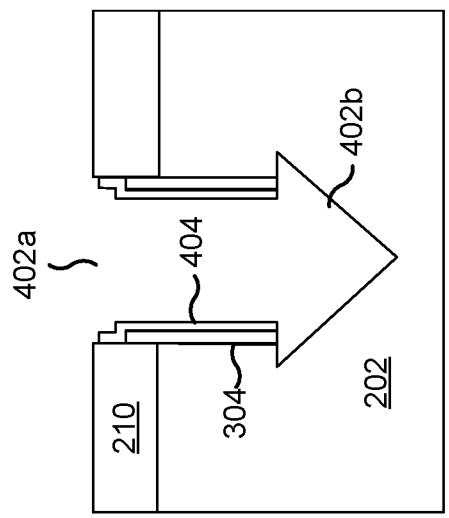
Figure 4J:
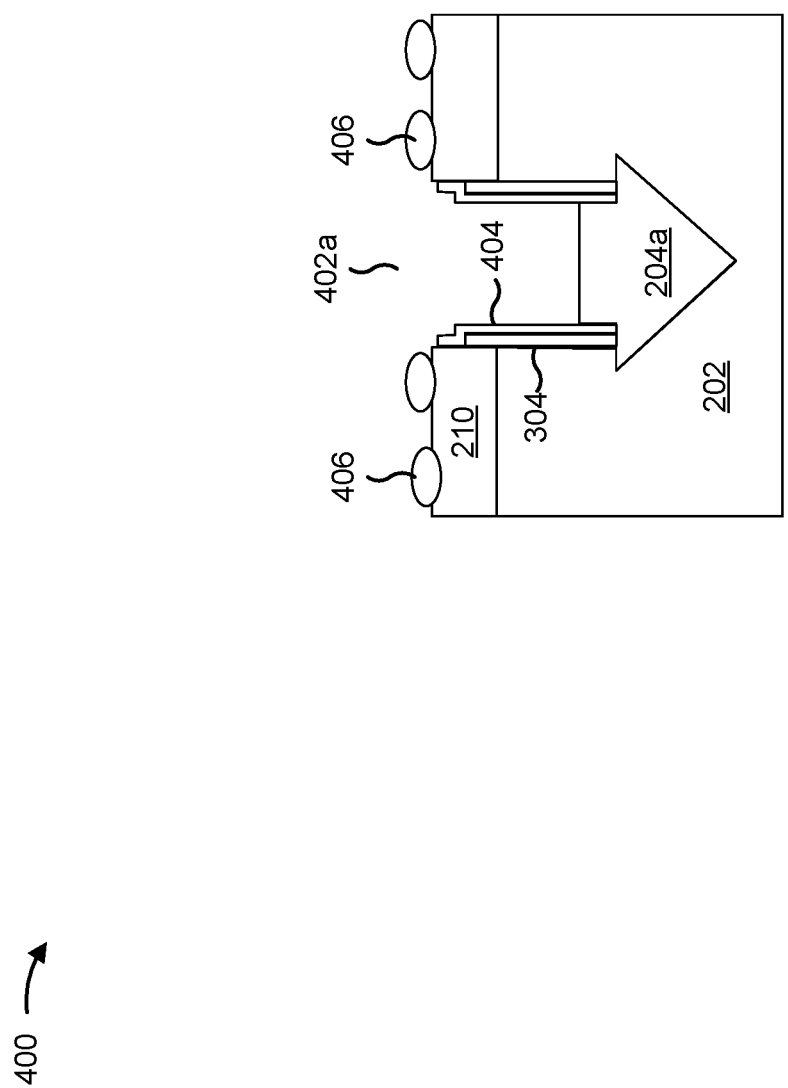
Figure 4K:
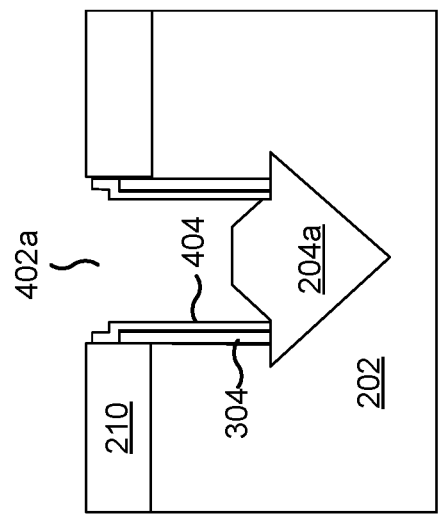
Figure 4L:
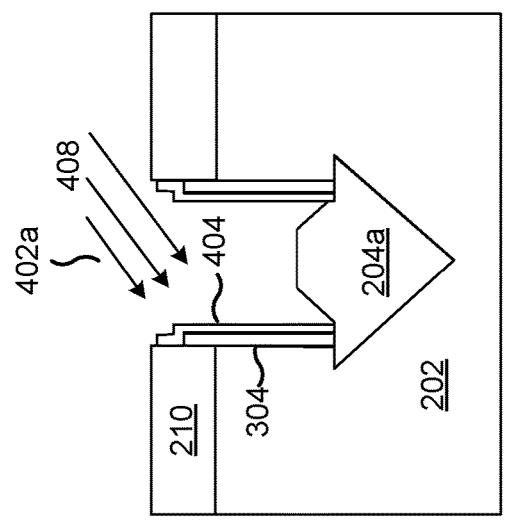
Figure 4M:
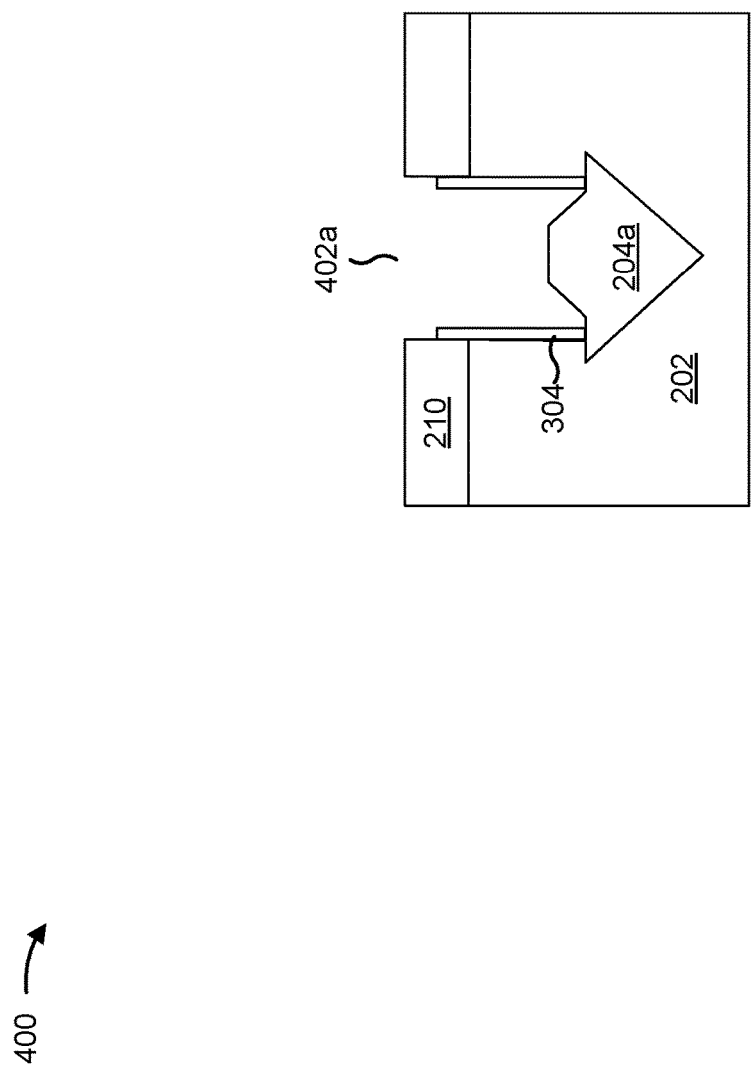
Figure 4N:
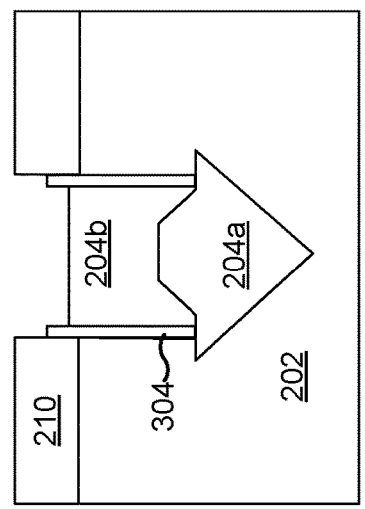
Figure 4O:
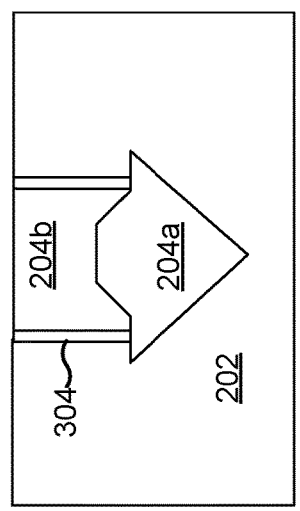
Figure 4O:
Figure 4P:
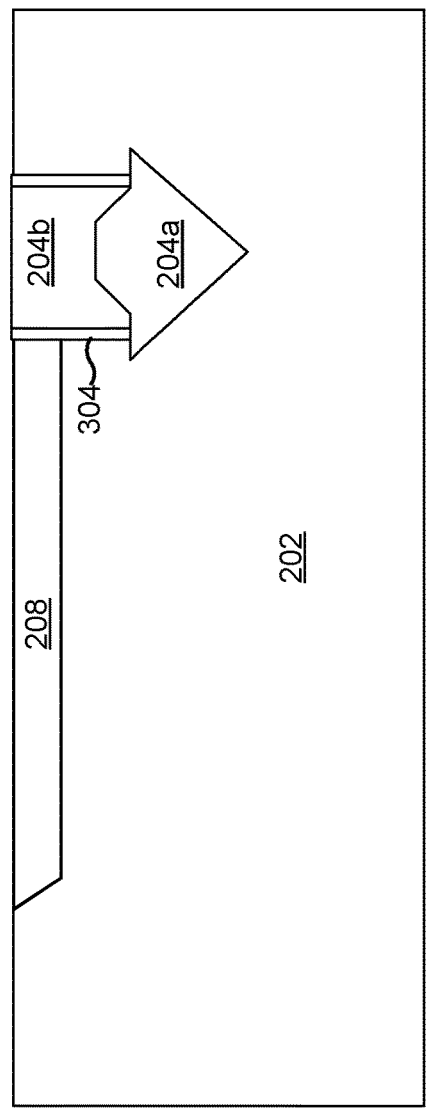
Figure 4Q:
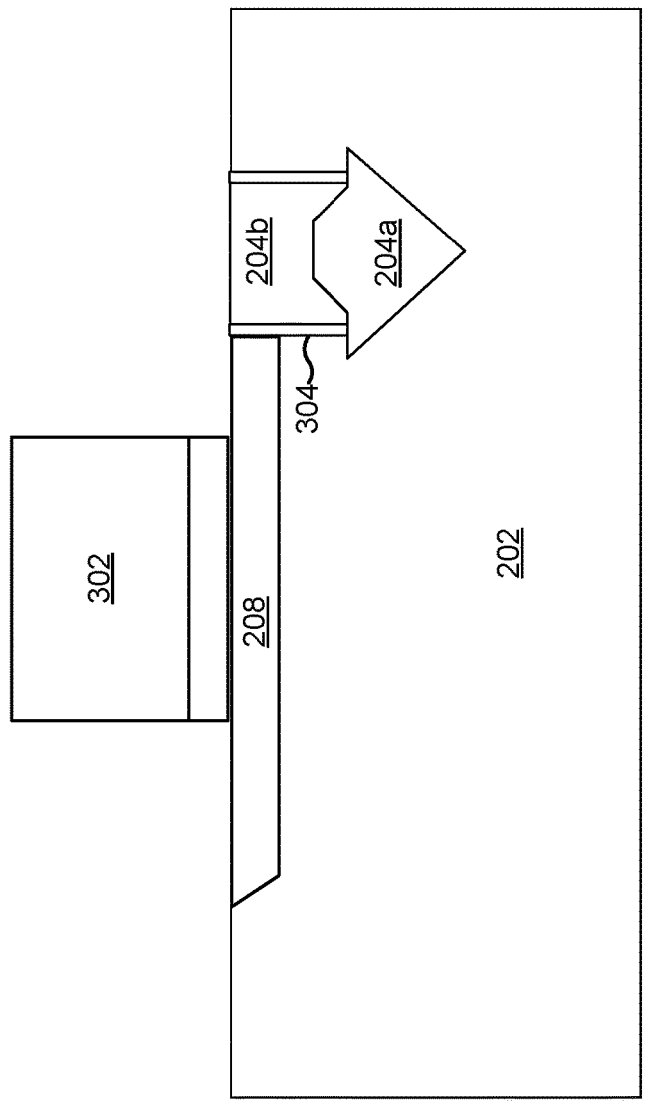
Figure 4R:
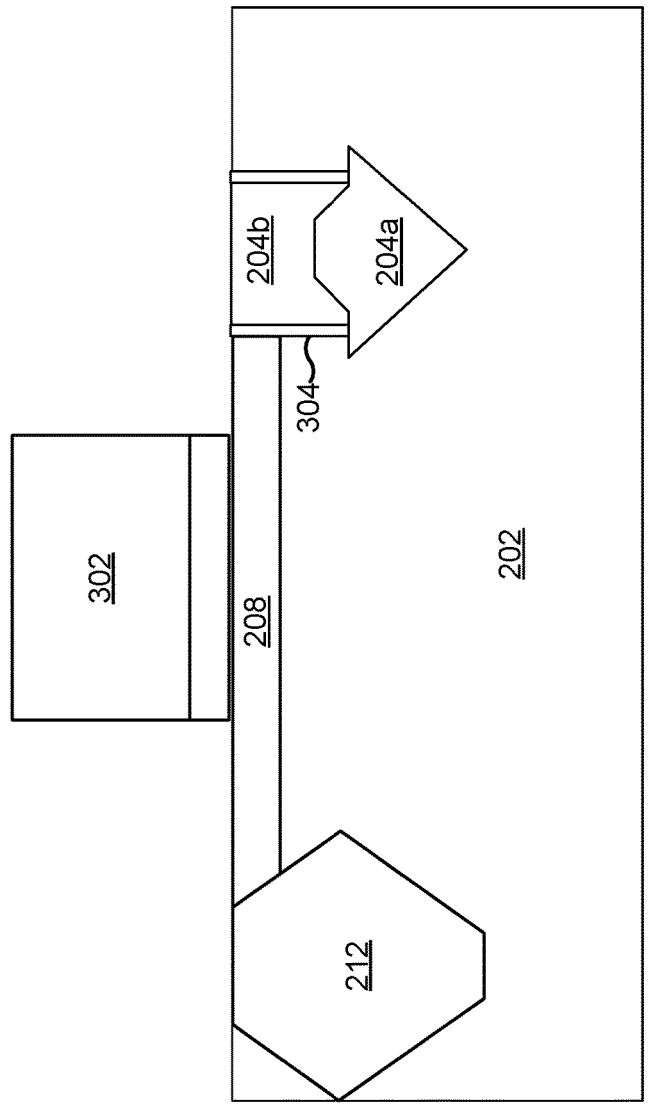

FIGS. 4A-4R are diagrams of an example implementation 400 described herein. Example implementation 400 includes a process for forming a GaN drain in two portions, as described herein. Additionally, example implementation 400 includes a process for implanting silicon in an AlN liner for a GaN drain. These processes may be implemented separately or may be implemented together as shown in FIGS. 4A-4R.

As shown in FIG. 4A, the example process for forming the drain may be performed in connection with a substrate 202. The substrate 202 may include a semiconductor die substrate, a semiconductor wafer, or another type of substrate in which semiconductor transistors may be formed. In some implementations, the substrate 202 is formed of silicon (Si) (e.g., a silicon substrate), a material including silicon, a III-V compound semiconductor material such as gallium arsenide (GaAs), a silicon on insulator (SOI), or another type of semiconductor material. In some implementations, the substrate 202 is formed of a doped material (e.g., a p-doped material or an n-doped material), such as a doped silicon. For example, the ion implantation tool 114 may dope the substrate 202 with positive ions (for p-type doping) or negative ions (for n-type doping).

As shown in FIG. 4B, a photoresist layer 210 may be formed over the substrate 202. For example, the deposition tool 102 may deposit the photoresist layer 210 by a CVD technique, a PVD technique, an ALD technique, or another type of deposition technique. The planarization tool 110 may planarize the photoresist layer 210 after the photoresist layer 210 is deposited. The photoresist layer 210 may include a metal, a silicon oxide ($SiO_x$), and/or another photoresist material.

As shown in FIG. 4C, the photoresist layer 210 may be patterned in preparation for etching the substrate 202. For example, the exposure tool 104 may expose the photoresist layer 210 to a radiation source to pattern the photoresist layer 210, and the developer tool 106 may develop and remove portions of the photoresist layer 210 to expose the pattern.

As shown in FIG. 4D, an upper recess 402a is formed in the substrate 202. For example, the etch tool 108 may etch portions of the substrate 202 to form the upper recess 402a. As further shown in FIG. 4D, the upper recess 402a may be substantially rectangular. As used herein, "substantially rectangular" refers to a three-dimensional structure where at least one cross-section of the structure (e.g., the cross-section depicted in FIG. 4D) has two sides (e.g., sidewalls in FIG. 4D) characterized by being within a few degrees of parallel. In some implementations, the cross-section may include two additional sides that are not parallel (e.g., such that the cross-section resembles a trapezoid) or that are within a few degrees of parallel (e.g., such that the cross-section resembles a rectangle).

As shown in FIG. 4E, a liner 304 comprising AlN may be formed. The deposition tool 102 may deposit the liner 304 by a CVD technique, a PVD technique, an ALD technique, or another type of deposition technique. As shown in FIG. 4E, the AlN may be deposited on the sidewalls and a bottom surface of the upper recess 402a. Additionally, the AlN may be deposited on the photoresist layer 210 (or, in implementations where the photoresist layer 210 has already been removed, on a top surface of the substrate 202). The deposition tool 102 may deposit the liner 304 to a depth in a range from approximately 1 nanometer (nm) to approximately 5 nm. By selecting a depth of at least approximately 1 nm, the liner 304 helps reduce lattice mismatch and thermal expansion coefficient difference between the substrate 202 and GaN to be formed in the upper recess 402a, which reduces cracking, gaps, and other defects in the drain. By selecting a depth of no more than approximately 5 nm, contact resistance between the GaN to be formed in the upper recess 402a and a channel 208 to be formed in the substrate 202 is not increased too significantly.

Accordingly, as shown in FIG. 4F, the AlN may be etched from the bottom surface of the upper recess 402a and from the photoresist layer 210 (or, in implementations where the photoresist layer 210 has already been removed, from the top surface the substrate 202). For example, the etch tool 108 may anisotropically etch the AlN such that the AlN remains on the sidewalls of the upper recess 402a. Additionally, as shown in FIG. 4F, the AlN may cover an entirety of a length of the sidewalls formed by the substrate 202 but only a portion of a length of the sidewalls formed by the photoresist layer 210. In some implementations, the etch tool 108 may perform a dry etch using a plasma, such as a boron trichloride ($BCl_3$) and oxygen ($O_2$) plasma.

As shown in FIG. 4G, a silicon nitride (SiN) layer 404 may be formed. The deposition tool 102 may deposit the SiN layer 404 by a CVD technique, a PVD technique, an ALD technique, or another type of deposition technique. As shown in FIG. 4F, the SiN layer 404 may be deposited over the sidewalls and a bottom surface of the upper recess 402a. Additionally, the SiN layer 404 may be deposited on the photoresist layer 210 (or, in implementations where the photoresist layer 210 has already been removed, on the top surface of the substrate 202). The deposition tool 102 may deposit the SiN layer 404 to a depth in a range from approximately 45 Angstroms (Å) to approximately 55 Å. By selecting a depth of at least approximately 45 Å, the SiN layer 404 is thick enough to provide for implanting silicon in the liner 304 (as described in greater detail with respect to FIG. 4L), which reduces contact resistance caused by the liner 304. By selecting a depth of no more than approximately 55 Å, the SiN layer 404 is thin enough to be etched without damaging the liner 304 and/or other layers shown in example implementation 400.

As shown in FIG. 4H, the SiN layer 404 may be etched from the bottom surface of the upper recess 402a and from the photoresist layer 210 (or, in implementations where the photoresist layer 210 has already been removed, from the top surface of the substrate 202). For example, the etch tool 108 may anisotropically etch the SiN layer 404 such that the SiN layer 404 remains on the sidewalls of the upper recess 402a. In some implementations, the etch tool 108 may perform a dry etch.

In some implementations, the SiN layer 404 may be omitted when silicon is directly implanted into the liner 304, as described in greater detail with respect to FIG. 4L. Alternatively, the SiN layer 404 may be omitted when silicon is not implanted into the liner 304.

As shown in FIG. 4I, a lower recess 402b is formed in the substrate 202. For example, the etch tool 108 may etch portions of the substrate 202 to form the lower recess 402b. In some implementations, the etch tool 108 may perform a wet etch, such as using tetramethyl ammonium hydroxide (TMAH). As further shown in FIG. 4I, the lower recess 402b may be substantially V-shaped. For example, the wet etch may concentrate toward a center of the bottom surface of the upper recess 402a, causing the substantial V-shape. Additionally, as shown in FIG. 4I, the lower recess 402b may be wider than the upper recess 402a because the wet etch may remove portions of the substrate 202 below non-etched portions of the substrate 202 adjacent to the upper recess 402a.

As shown in FIG. 4J, a buffer portion 204a of gallium nitride and carbon (GaN:C) may be formed at least in the lower recess 402b. The deposition tool 102 may deposit the GaN:C by an ALD technique or another type of deposition technique. In some implementations, the GaN:C may comprise alternating layers of GaN and C. The buffer portion 204a helps prevent current leakage into the substrate 202. Additionally, the GaN:C does not form a crystalline structure and, therefore, fills the substantially V-shaped lower recess 402b without gaps.

As further shown in FIG. 4J, polycrystalline GaN:C (poly-GaN:C) 406 is also formed on the photoresist layer 210 (or, in implementations where the photoresist layer 210 has already been removed, on the top surface of the substrate 202). Accordingly, as shown in FIG. 4K, the poly-GaN:C 406 may be removed. For example, the etch tool 108 may etch the poly-GaN:C 406. In some implementations, the etch tool 108 may perform a wet etch, such as using hydrochloric acid (HCl).

As further shown in FIG. 4K, the etch tool 108 may additionally remove a portion of the GaN:C such that the buffer portion 204a has a substantially flat (e.g., within a few degrees of 0° relative to a horizontal axis) first top surface portion, a slanted (e.g., more than 10° relative to the horizontal axis) top surface portion, and a substantially flat second top surface portion. Additionally, as shown in FIG. 4K, the second top surface portion may be lower relative to a top surface of the substrate 202 than the first top surface portion, and the top surface portions are connected via the slanted top surface portion. Furthermore, because the buffer portion 204a is formed in the lower recess 402b, the buffer portion 204a has a substantially V-shaped bottom surface. As a result, sides of the liner 304 do not physically contact the buffer portion 204a, which prevents carbonization of the liner 304.

As shown in FIG. 4L, the ion implantation tool 114 may dope the liner 304 with silicon atoms 408. For example, the ion implantation tool 114 may bombard the SiN layer 404 with photons, protons, electrons, and/or ions that cause silicon atoms 408 of the SiN layer 404 to move into the liner 304. As an alternative, in implementations without the SiN layer 404, the ion implantation tool 114 may bombard the liner 304 with silicon atoms 408 directly.

As shown in FIG. 4M, the SiN layer 404 may be etched. For example, the etch tool 108 may anisotropically etch the SiN layer 404 from the sidewalls of the upper recess 402a. Accordingly, in some implementations, the etch tool 108 may perform a dry etch. Alternatively, the etch tool 108 may isotropically etch the SiN layer 404. Accordingly, in some implementations, the etch tool 108 may perform a wet etch.

As shown in FIG. 4N, a drain portion 204b comprising crystalline gallium nitride (GaN, such as c-GaN) may be formed at least in the upper recess 402a. The deposition tool 102 may deposit the GaN by epitaxial growth. Because the upper recess 402a is substantially rectangular, the drain portion 204b may grow in a cubic crystalline structure without significant gaps.

Additionally, the drain portion 204b may be n-doped (n-GaN). For example, the ion implantation tool 114 may implant negative ions into the GaN. Additionally, or alternatively, the deposition tool 102 may use negative ions during a deposition process such that the GaN epitaxially grows as n-GaN.

As shown in FIG. 4O, the photoresist layer 210 may be etched. For example, the photoresist removal tool 116 may dissolve the photoresist 210 using a buffered oxide etch (BOE).

As shown in FIG. 4P, a channel 208 may be formed in the substrate 202. The channel 208 may be n-doped (e.g., n-doped silicon). For example, the ion implantation tool 114 may implant negative ions into the substrate 202. The channel 208 may be formed such that the channel 208 interfaces with the drain at the liner 304.

As shown in FIG. 4Q, a gate structure 302 may be formed over the channel 208. For example, the deposition tool 102 may deposit polysilicon, metal (e.g., tungsten), and/or another type of conductive material to form the gate structure 302. In some implementations, the deposition tool 102 may perform multiple deposition operations (and, in some implementations, alternated with etch operations performed by the etch tool 108) such that the gate structure 302 includes multiple layers of material, such as multiple layers of metal and/or multiple layers of polysilicon.

As shown in FIG. 4R, a source 212 may be formed in the substrate 202. The source 212 may be formed on an opposite side of the channel 208 as the drain. For example, the ion implantation tool 114 may implant positive ions into the substrate 202 to form the source 212 (e.g., forming p-doped silicon). Accordingly, current may flow from the GaN of the drain structure 204 to the source 212 when the gate structure 302 is activated.

By using techniques as described in connection with FIGS. 4A-4R, a buffer portion 204a of gallium nitride and carbon (GaN:C) (e.g., in the form of composite layers) provides a buffer between gallium nitride (GaN) of a drain portion 204b and silicon of the substrate 202. As a result, gaps and other defects caused by lattice mismatch are reduced, which improves electrical performance of the transistor. Additionally, current leakage into the substrate 202 is reduced, which further improves electrical performance of the drain. Additionally, some silicon is implanted in the liner 304. The implanted silicon reduces contact resistance at an interface between the GaN of the drain portion 204b and the silicon of the channel 208. As a result, electrical performance of the transistor is improved.

As indicated above, FIGS. 4A-4R are provided as an example. Other examples may differ from what is described with regard to FIGS. 4A-4R. For example, the liner 304 may be implanted with silicon even when the GaN drain is comprised of only GaN and not partly of GaN:C. Similarly, the GaN drain may be formed partly of GaN:C even when the liner 304 is not implanted with silicon. In another example, a pixel sensor (e.g., as described in connection with FIG. 2) may be formed in lieu of a transistor with the gate structure 302.

Figure 5:
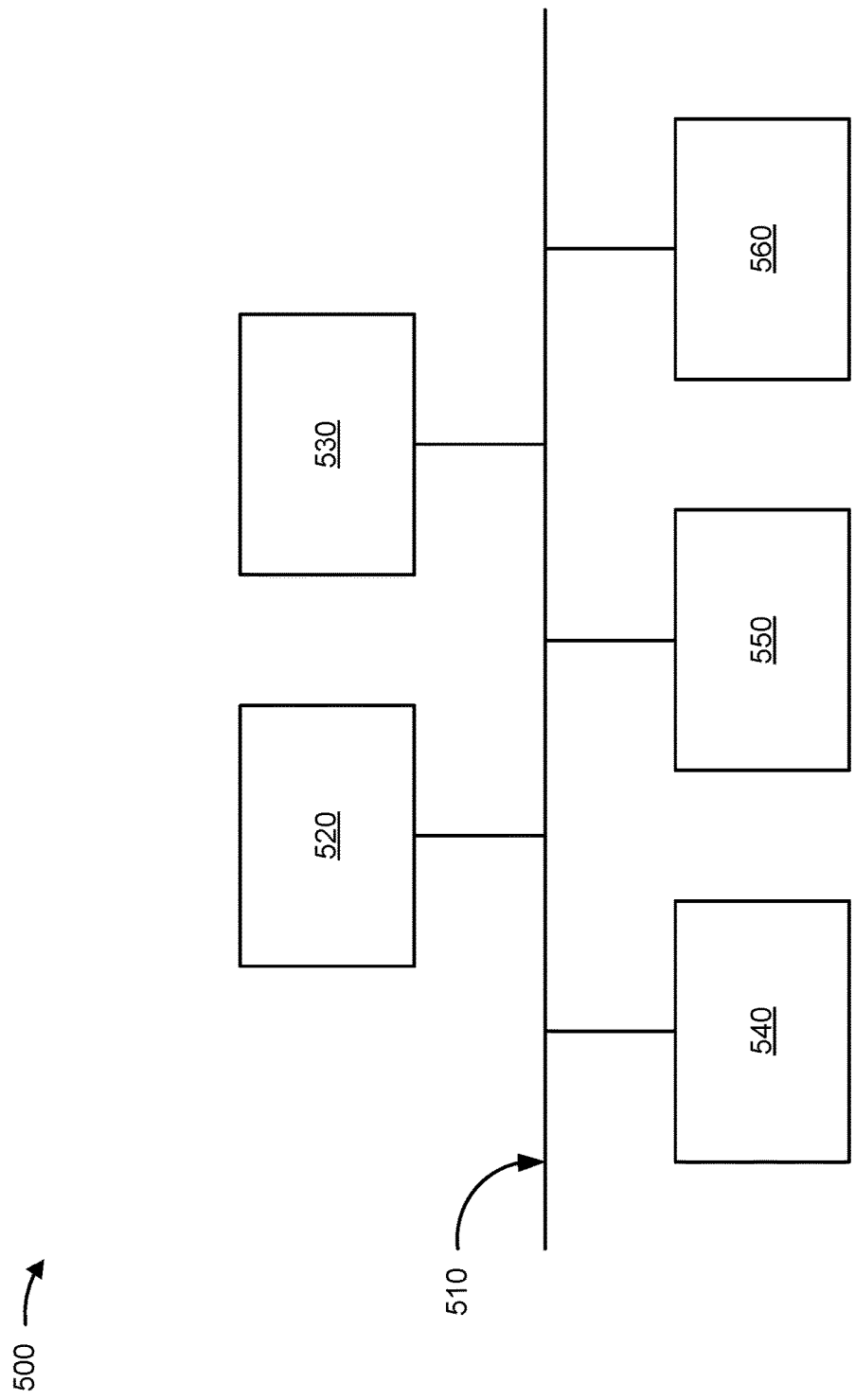
FIG. 5 is a diagram of example components of one or more devices of FIG. 1 described herein.

FIG. 5 is a diagram of example components of a device 500. In some implementations, one or more of the semiconductor processing tools 102-116 and/or the wafer/die transport tool 118 may include one or more devices 500 and/or one or more components of device 500. As shown in FIG. 5, device 500 may include a bus 510, a processor 520, a memory 530, an input component 540, an output component 550, and a communication component 560.

Bus 510 includes one or more components that enable wired and/or wireless communication among the components of device 500. Bus 510 may couple together two or more components of FIG. 5, such as via operative coupling, communicative coupling, electronic coupling, and/or electric coupling. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware or a combination of hardware and software. In some implementations, processor 520 includes one or more processors capable of being programmed to perform one or more operations or processes described elsewhere herein.

Memory 530 includes volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 includes one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry may be used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
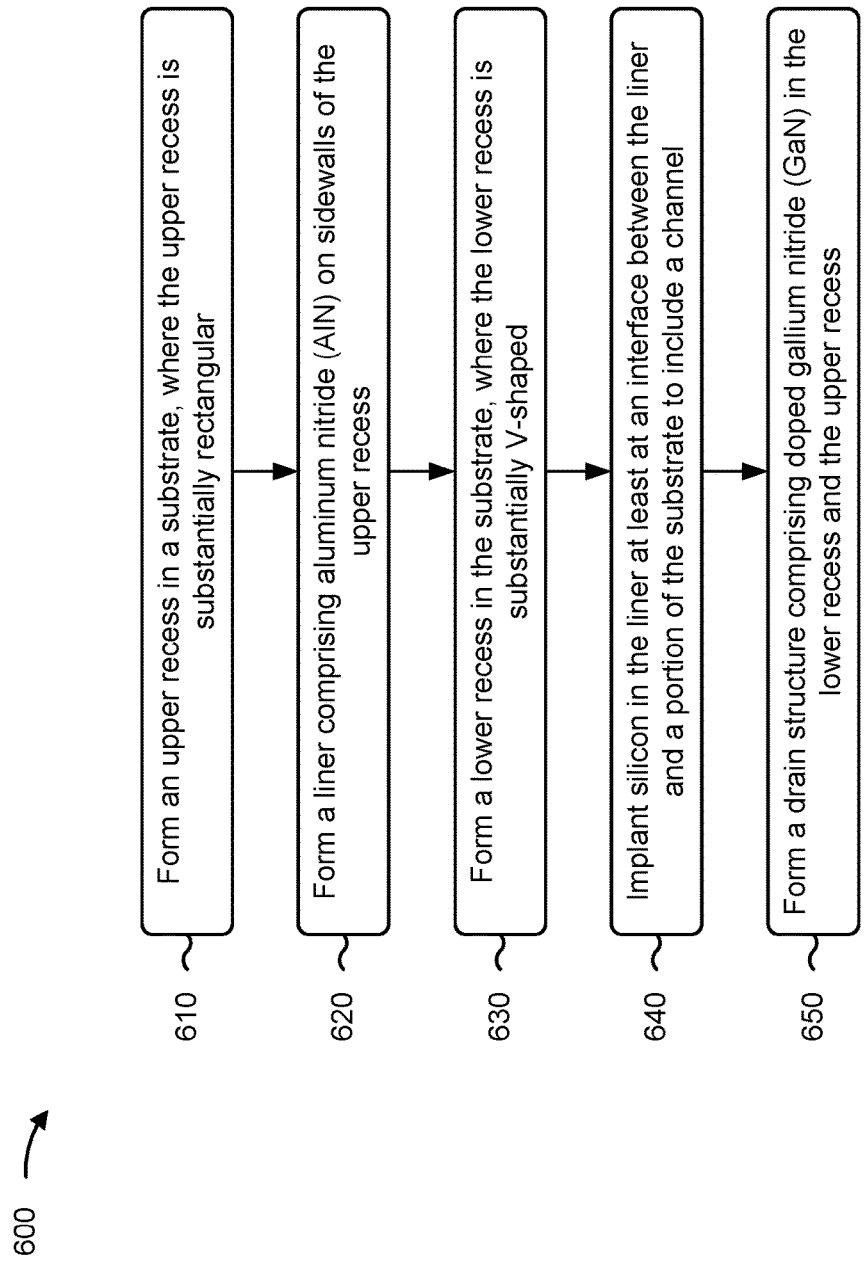

FIG. 6 is a flowchart of an example process 600 associated with forming gallium nitride drain structures. In some implementations, one or more process blocks of FIG. 6 may be performed by one or more semiconductor processing tools (e.g., one or more of the semiconductor processing tools 102-116). Additionally, or alternatively, one or more process blocks of FIG. 6 may be performed by one or more components of device 500, such as processor 520, memory 530, input component 540, output component 550, and/or communication component 560.

As shown in FIG. 6, process 600 may include forming an upper recess in a substrate (block 610). For example, the one or more semiconductor processing tools 102-116 may form an upper recess 402a in a substrate 202, as described herein. The upper recess 402a may be substantially rectangular.

As further shown in FIG. 6, process 600 may include forming a liner comprising aluminum nitride (AlN) on sidewalls of the upper recess (block 620). For example, the one or more semiconductor processing tools 102-116 may form a liner 304 comprising aluminum nitride (AlN) on sidewalls of the upper recess 402a, as described herein.

As further shown in FIG. 6, process 600 may include forming a lower recess in the substrate (block 630). For example, the one or more semiconductor processing tools 102-116 may form a lower recess 402b in the substrate 202, as described herein. The lower recess 402b may be substantially V-shaped.

As further shown in FIG. 6, process 600 may include implanting silicon in the liner at least at an interface between the liner and a portion of the substrate to include a channel (block 640). For example, the one or more semiconductor processing tools 102-116 may implant silicon in the liner 304 at least at an interface between the liner 304 and a portion of the substrate 202 to include a channel 208, as described herein.

As further shown in FIG. 6, process 600 may include forming a gallium nitride (GaN) drain in the lower recess and the upper recess (block 650). For example, the one or more semiconductor processing tools 102-114 may form a drain structure 204 comprising doped gallium nitride (GaN) in the lower recess 402b and the upper recess 402a, as described herein.

Process 600 may include additional implementations, such as any single implementation or any combination of implementations described below and/or in connection with one or more other processes described elsewhere herein.

In a first implementation, forming the upper recess 402a includes patterning a photoresist material 210 over the substrate 202 and forming the upper recess 402a in the substrate 202 using lithography, where the photoresist material 210 is removed after the drain structure 204 is formed.

In a second implementation, alone or in combination with the first implementation, forming the liner 304 includes depositing AlN on the sidewalls and a bottom surface of the upper recess 402a and etching the AlN from the bottom surface of the upper recess 402a.

In a third implementation, alone or in combination with one or more of the first and second implementations, process 600 further includes forming a layer of silicon nitride (SiN) 404 on the sidewalls and a bottom surface of the upper recess 402a, and etching the SiN 404 from the bottom surface of the upper recess.

In a fourth implementation, alone or in combination with one or more of the first through third implementations, implanting the silicon in the liner 304 includes bombarding the layer of SiN 404 to implant silicon atoms in the liner 304.

In a fifth implementation, alone or in combination with one or more of the first through fourth implementations, process 600 further includes etching the layer of SiN 404 from the sidewalls of the upper recess 402a.

In a sixth implementation, alone or in combination with one or more of the first through fifth implementations, forming the drain structure 204 includes forming a buffer portion 204a comprising gallium nitride and carbon (GaNC) in at least the lower recess 402b, and forming a drain portion 204b comprising doped gallium nitride (GaN) in at least the upper recess 402a.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

FIG. 7 is a flowchart of an example process 700 associated with forming gallium nitride drain structures. In some implementations, one or more process blocks of FIG. 7 may be performed by one or more semiconductor processing tools (e.g., one or more of the semiconductor processing tools 102-116). Additionally, or alternatively, one or more process blocks of FIG. 7 may be performed by one or more components of device 500, such as processor 520, memory 530, input component 540, output component 550, and/or communication component 560.

As shown in FIG. 7, process 700 may include forming an upper recess in a substrate (block 710). For example, the one or more semiconductor processing tools 102-116 may form an upper recess 402a in a substrate 202, as described herein. The upper recess 402a may be substantially rectangular.

As further shown in FIG. 7, process 700 may include forming a liner comprising aluminum nitride (AlN) on sidewalls of the upper recess (block 720). For example, the one or more semiconductor processing tools 102-116 may form a liner 304 comprising aluminum nitride (AlN) on sidewalls of the upper recess 402a, as described herein.

As further shown in FIG. 7, process 700 may include forming a lower recess in the substrate (block 730). For example, the one or more semiconductor processing tools 102-116 may form a lower recess 402b in the substrate 202, as described herein. The lower recess 402b may be substantially V-shaped.

As further shown in FIG. 7, process 700 may include forming a buffer portion comprising gallium nitride and carbon (GaN:C) in at least the lower recess (block 740). For example, the one or more semiconductor processing tools 102-116 may form a buffer portion 204a comprising gallium nitride and carbon (GaN:C) in at least the lower recess 402b, as described herein.

As further shown in FIG. 7, process 700 may include forming a drain portion comprising doped gallium nitride (GaN) in at least the upper recess (block 750). For example, the one or more semiconductor processing tools 102-116 may form a drain portion 204b comprising doped gallium nitride (GaN) in at least the upper recess 402a, as described herein.

Process 700 may include additional implementations, such as any single implementation or any combination of implementations described below and/or in connection with one or more other processes described elsewhere herein.

In a first implementation, forming the lower recess 402b includes using tetramethyl ammonium hydroxide (TMAH) to etch the lower recess 402b under the upper recess 402a.

In a second implementation, alone or in combination with the first implementation, forming the buffer portion 204a includes: depositing gallium nitride and carbon using atomic layer deposition (ALD), such that the GaN:C is formed in the lower recess 402b and polycrystalline GaN:C (poly-GaN:C) 406 is formed over the substrate 202, and etching the poly-GaN:C 406 using hydrochloric acid (HCl).

In a third implementation, alone or in combination with one or more of the first and second implementations, a portion of the GaN:C adjacent to the liner 304 is etched by the HCl, such that the buffer portion 204a has a substantially flat first top surface portion, a slanted top surface portion, a substantially flat second top surface portion, and a substantially V-shaped bottom surface.

In a fourth implementation, alone or in combination with one or more of the first through third implementations, process 700 further includes forming doped silicon on the substrate 202 that has an interface with the liner 304 to form a channel 208.

In a fifth implementation, alone or in combination with one or more of the first through fourth implementations, process 700 further includes forming a gate structure 302 and a source 212 that electrically connect to the channel 208, where the gate structure 302 is associated with a breakdown field larger than $7 \times 10^5$ V/cm.

In a sixth implementation, alone or in combination with one or more of the first through fifth implementations, process 700 further includes: forming a photoresist layer 210 over the substrate 202, where the photoresist layer 210 is used to form the upper recess 402a with lithography, and etching the photoresist layer 210 using a buffered oxide etch (BOE) after forming the drain portion 204b.

In a seventh implementation, alone or in combination with one or more of the first through sixth implementations, process 700 further includes implanting silicon in the liner 304 at least at an interface between the liner 304 and a portion of the substrate 202 to include a channel 208.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

In this way, depositing gallium nitride and carbon (GaN:C) (e.g., in the form of composite layers) when forming a gallium nitride drain of a transistor provides a buffer between the gallium nitride of the drain and silicon of the substrate in which the drain is formed. As a result, gaps and other defects caused by lattice mismatch are reduced, which improves electrical performance of the drain. Additionally, current leakage into the substrate is reduced, which further improves electrical performance of the drain. Additionally, or alternatively, implanting silicon in an aluminum nitride (AlN) liner for a gallium nitride drain reduces contact resistance at an interface between the gallium nitride and the silicon. As a result, electrical performance of the transistor is improved.

As described in greater detail above, some implementations described herein provide a semiconductor device. The semiconductor device includes a substrate and a drain comprising a buffer portion in the substrate, a drain portion above the buffer portion, and a liner disposed between the drain portion and the substrate, wherein the buffer portion comprises gallium nitride and carbon (GaN:C), the drain portion comprises dropped gallium nitride (GaN), and the liner comprises aluminum nitride (AlN). The semiconductor device further includes a source comprising doped material. The semiconductor device includes a channel electrically connecting the drain to the source, wherein the liner includes implanted silicon at least at an interface between the channel and the liner.

As described in greater detail above, some implementations described herein provide a method. The method includes forming an upper recess in a substrate, wherein the upper recess is substantially rectangular. The method further includes forming a liner comprising aluminum nitride (AlN) on sidewalls of the upper recess. The method includes forming a lower recess in the substrate, wherein the lower recess is substantially V-shaped. The method further includes implanting silicon in the liner at least at an interface between the liner and a portion of the substrate to include a channel. The method includes forming a drain structure comprising doped gallium nitride (GaN) in the lower recess and the upper recess.

As described in greater detail above, some implementations described herein provide a method. The method includes forming an upper recess in a substrate, wherein the upper recess is substantially rectangular. The method further includes forming a liner comprising aluminum nitride (AlN) on sidewalls of the upper recess. The method includes forming a lower recess in the substrate, wherein the lower recess is substantially V-shaped. The method further includes forming a buffer portion comprising gallium nitride and carbon (GaN:C) in at least the lower recess. The method includes forming a drain portion comprising doped gallium nitride (n-GaN) in at least the upper recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a drain structure in the substrate comprising a buffer portion in the substrate, a drain portion above the buffer portion, and a liner disposed between the drain portion and the substrate, wherein the buffer portion comprises gallium nitride and carbon (GaN:C), the drain portion comprises doped gallium nitride (GaN), and the liner comprises aluminum nitride (AlN);
   a source comprising doped material; and
   a channel electrically connecting the drain to the source, wherein the liner includes implanted silicon at least at an interface between the channel and the liner.

2. The semiconductor device of claim 1, further comprising:
   a gate structure formed over the channel,
   wherein the gate structure is associated with a breakdown field larger than $7 \times 10^5$ Volts per centimeter (V/cm).

3. The semiconductor device of claim 1, wherein current is to flow from the drain structure to the source through the channel with a current density of at least 5400 milliamperes per millimeter (mA/mm) at 10 Volts.

4. The semiconductor device of claim 1, wherein the drain portion comprises cubic GaN (c-GaN).

5. The semiconductor device of claim 1, wherein the buffer portion forms a substantially V-shaped structure.

6. The semiconductor device of claim 1, wherein the liner has a thickness of no more than 5 nanometers (nm).

7. A method, comprising:
   forming an upper recess in a substrate, wherein the upper recess is substantially rectangular;
   forming a liner comprising aluminum nitride (AlN) on sidewalls of the upper recess;
   forming a lower recess in the substrate, wherein the lower recess is substantially V-shaped;
   implanting silicon in the liner at least at an interface between the liner and a portion of the substrate to include a channel; and
   forming a drain structure comprising doped gallium nitride (GaN) in the lower recess and the upper recess.

8. The method of claim 7, wherein forming the upper recess comprises:
   patterning a photoresist material over the substrate; and
   forming the upper recess in the substrate using lithography,
   wherein the photoresist material is removed after the drain structure is formed.

9. The method of claim 7, wherein forming the liner comprises:
   depositing AlN on the sidewalls and a bottom surface of the upper recess; and
   etching the AlN from the bottom surface of the upper recess.

10. The method of claim 7, further comprising:
    forming a layer of silicon nitride (SiN) on the sidewalls and a bottom surface of the upper recess; and
    etching the SiN from the bottom surface of the upper recess.

11. The method of claim 10, wherein implanting the silicon in the liner comprises:
    bombarding the layer of SiN to implant silicon atoms in the liner.

12. The method of claim 10, further comprising:
    etching the layer of SiN from the sidewalls of the upper recess.

13. The method of claim 7, wherein forming the drain structure comprises:
    forming a buffer portion comprising gallium nitride and carbon (GaN:C) in at least the lower recess; and
    forming a drain portion comprising doped gallium nitride (n-GaN) in at least the upper recess.

14. A method, comprising:
   forming an upper recess in a substrate, wherein the upper recess is substantially rectangular;
   forming a liner comprising aluminum nitride (AlN) on sidewalls of the upper recess;
   forming a lower recess in the substrate, wherein the lower recess is substantially V-shaped;
   forming a buffer portion comprising gallium nitride and carbon (GaN:C) in at least the lower recess; and
   forming a drain portion comprising doped gallium nitride (n-GaN) in at least the upper recess.

15. The method of claim 14, wherein forming the lower recess comprises:
   using tetramethyl ammonium hydroxide (TMAH) to etch the lower recess under the upper recess.

16. The method of claim 14, wherein forming the buffer portion comprises:
   depositing gallium nitride and carbon using atomic layer deposition (ALD), wherein the GaN:C is formed in the lower recess and polycrystalline GaN:C (poly-GaN:C) is formed over the substrate; and
   etching the poly-GaN:C using hydrochloric acid (HCl).

17. The method of claim 16, wherein a portion of the GaN:C adjacent to the liner is etched by the HCl, and wherein the buffer portion has a substantially flat first top surface portion, a slanted top surface portion, a substantially flat second top surface portion, and a substantially V-shaped bottom surface.

18. The method of claim 14, further comprising:
   forming doped silicon on the substrate that has an interface with the liner to form a channel.

19. The method of claim 18, further comprising:
   forming a gate structure and a source that electrically connect to the channel,
   wherein the gate structure is associated with a breakdown field larger than $7 \times 10^5$ Volts per centimeter (V/cm).

20. The method of claim 14, further comprising:
   forming a photoresist layer over the substrate, wherein the photoresist layer is used to form the upper recess with lithography; and
   etching the photoresist layer using a buffered oxide etch (BOE) after forming the drain portion.

* * * * *